(12) United States Patent
Endo et al.

(10) Patent No.: US 7,494,899 B2
(45) Date of Patent: Feb. 24, 2009

(54) METHOD FOR MANUFACTURING SEMICONDUCTOR SUBSTRATE

(75) Inventors: Akihiko Endo, Tokyo (JP); Nobuyuki Morimoto, Tokyo (JP)

(73) Assignee: Sumco Corporation, Tokyo (JP)

( * ) Notice: Subject to any disclaimer, the term of this patent is extended or adjusted under 35 U.S.C. 154(b) by 662 days.

(21) Appl. No.: 11/105,574

(22) Filed: Apr. 14, 2005

(65) Prior Publication Data

US 2007/0004169 A1    Jan. 4, 2007

(51) Int. Cl.
*H01L 21/30* (2006.01)
(52) U.S. Cl. .............. 438/459; 438/458; 438/464; 257/E21.568; 257/E21.57
(58) Field of Classification Search .......... 438/464, 438/458, 460, 459; 257/E21.568, E21.57
See application file for complete search history.

(56) References Cited

U.S. PATENT DOCUMENTS 6,290,804 B1 * 9/2001 Henley et al. .......... 156/344
7,052,974 B2 * 5/2006 Mitani et al. ........... 438/459

FOREIGN PATENT DOCUMENTS

JP    05-211128    8/1993

* cited by examiner

*Primary Examiner*—George Fourson
*Assistant Examiner*—Julio J. Maldonado
(74) *Attorney, Agent, or Firm*—Pillsbury Winthrop Shaw Pittman, LLP

(57) ABSTRACT

This method for manufacturing a semiconductor substrate is characterized in that the method includes: a step of ion-implanting light element to a predetermined depth position in a single-crystal wafer of which a surface is a cleavage plane; and a step of heat-treating the single-crystal wafer so as to form light-element bubbles along a cleavage plane parallel to the surface of the single-crystal wafer within an ion-implanted region and thereby splitting off a portion of the single-crystal wafer on an ion-implanted side.

3 Claims, 5 Drawing Sheets

BONDING,
HEAT TREATMENT

SPLITTING

POLISHING

METHOD FOR MANUFACTURING SEMICONDUCTOR SUBSTRATE

BACKGROUND OF THE INVENTION

1. Field of the Invention

The present invention relates to a method for manufacturing a semiconductor substrate. More specifically, it relates to a technique that involves heat-treating a single-crystal wafer in which light element has been ion-implanted at a predetermined depth position, then splitting off the single-crystal wafer from inside the ion-implanted region.

2. Background Art

Recently developed methods for manufacturing semiconductor wafers having a silicon-on-insulator (SOI) structure include the Smart Cut process described in Japanese Patent Application, First Publication No. H05-211128.

The Smart Cut process begins by ion-implanting hydrogen (a light element) to a predetermined depth position in an active-layer-forming wafer, then bonding together the ion-implanted active-layer-forming wafer and a supporting wafer for supporting the active-layer-forming wafer, with an oxide layer therebetween, to form a bonded wafer. The bonded wafer is then placed in a heat treatment furnace and subjected to bonding heat treatment, during which hydrogen bubbles form within the ion-implanted region. Hydrogen bubble formation causes the active-layer-forming wafer to split off, leaving behind an active layer, over the intervening oxide layer, on the supporting wafer side, thereby giving a bonded SOI wafer.

In the prior art, a (100) wafer composed of single-crystal silicon whose surface is a (100) plane is used as the active-layer-forming wafer. Moreover, during this heat treatment, the entire region within the wafer plane is heated at substantially the same time to a temperature greater than the hydrogen bubble forming temperature.

Prior-art active-layer-forming wafers are (100) wafers in which the wafer surface is a (100) plane. But, because the (100) plane is not a cleavage plane, the hydrogen bubbles form irregularly throughout the thickness direction in the ion-implanted region during heat treatment. Hence, the split surface of the active layer has a large roughness, increasing the amount of polishing in the polishing step, or etching in the etching step, required to planarize the wafer after splitting. The result has been a lower in-plane uniformity in the thickness of the active layer, preventing a high flatness from being achieved.

SUMMARY OF THE INVENTION

Therefore, an object of the present invention is to provide a method for manufacturing semiconductor substrates which controls the roughness at the split surface of the wafer, thus increasing the in-plane uniformity in the wafer thickness after splitting and reducing the amount of wafer processing during subsequent planarization of the split surface.

As a result of extensive investigations, we have discovered that by using a (111) wafer or a (110) wafer in which the wafer surface is a cleavage plane rather than the commonly used (100) wafer as an active-layer-forming wafer, a lower roughness can be achieved at the active layer surface (split surface), increasing the in-plane uniformity in the thickness of the active layer following splitting and reducing the amount of wafer processing required during planarization of the split surface.

Of the planes in single-crystal silicon, the (111) plane has the highest atom density and highest Young's modulus. The (110) plane has the second-highest atom density and Young's modulus next to the (111) plane. Moreover, the bond strength between (111) planes and the bond strength between (110) planes are smaller than the bond strength between other planes, such as (100) planes. Hence, cleavage readily occurs at the (111) and (110) planes in the single-crystal silicon.

We have also found that, following ion implantation, if heat treatment is carried out parallel to the wafer surface and successively from one end of the wafer, hydrogen bubble nuclei caused by ion implantation form in order from one end of the wafer at an intermediate portion of the ion-implanted region in the thickness direction where the implant density is greatest, and that the hydrogen bubbles continuously grow. We thus confirmed that, compared with the simultaneous heat treatment of the entire region in the plane of the wafer as in the prior art, the hydrogen bubble-forming region has a smaller thickness, resulting in a higher flatness at the split surface.

Accordingly, the present invention provides a method for manufacturing a semiconductor substrate which includes a step of ion-implanting light element to a predetermined depth position in a single-crystal wafer of which a surface is a cleavage plane; and a step of heat treating the single-crystal wafer so as to form light-element bubbles along a cleavage plane parallel to the surface of the single-crystal wafer within an ion-implanted region and thereby splitting off a portion of the single-crystal wafer on an ion-implanted side.

In this method for manufacturing a semiconductor substrate, the light element is ion-implanted to a predetermined depth position in a single-crystal wafer, thereby forming the ion-implanted region parallel to the wafer surface that is a cleavage plane. The single-crystal wafer is then heat-treated so as to form the light-element bubbles along the cleavage plane parallel to the surface of the wafer within the ion-implanted region, causing a portion of the single-crystal wafer on the ion-implanted side to readily split off. For example, if the wafer is made of single-crystal silicon, cleavage planes which are (111) planes or (110) planes have a high atom density and Young's modulus. Moreover, the bond strength between cleavage planes is smaller than the bond strength between other planes, including (100) planes. Hence, the cleavage planes are readily cleaved, and the cleaved surface has a high flatness. The split surface of the wafer thus has a low roughness, increasing the in-plane uniformity in the wafer thickness after splitting. As a result, the amount of wafer processing during subsequent planrization of the split surface decreases.

No limitation is imposed on the type of single-crystal wafer. For example, use can be made of single-crystal wafers having a cleavage plane, such as single-crystal silicon wafers. Single-crystal silicon wafers that can be used are (111) wafers and (110) wafers. A (111) wafer is a single-crystal wafer having a surface that is a (111) plane, and a (110) wafer is a single-crystal wafer having a surface that is a (110) plane. In the case of a (110) wafer, during growth of the (110) silicon single-crystal, (111) twinning plane and slip dislocation plane are orthogonal to the (110) growth plane. This makes it difficult to grow a dislocation-free silicon single-crystal. Hence, (111) wafers are currently more advantageous for industrial use. In single-crystal wafers having a surface which is a cleavage plane, all planes parallel to the wafer surface are cleavage planes, regardless of the depth position from the wafer surface.

The single-crystal wafer subjected to splitting treatment using light-element bubbles may be any of various semiconductor wafers intended for individual use, or it may be a wafer intended for use in a bonded wafer having a SOI structure. For example, it may be an active-layer-forming wafer of the type typically used in a UNIBOND wafer produced by the Smart Cut process.

No limitation is imposed on the type of light element. In addition to hydrogen (H), other suitable examples include rare gases such as helium (He), neon (Ne), argon (Ar), krypton (Kr), xenon (Xe) and radon (Rn). These may be used in uncombined form or in the form of a compound.

No limitation is imposed on the dose of the light element during ion implantation. The dose may be, for example, from $2 \times 10^{16}$ to $8 \times 10^{16}$ atoms/cm$^3$. The present invention is characterized by wafer splitting with light-element bubbles using the cleavage plane of single-crystal silicon.

No limitation is imposed on the acceleration voltage during light-element ion implantation.

The heat treatment temperature during single-crystal wafer splitting is 400 to 700° C., and preferably 450 to 550° C. In the case in which the temperature is less than 400° C., it is difficult to form light-element bubbles from the light element that has been ion-implanted into the semiconductor wafer, whereas in the case in which the temperature is more than 700° C., oxygen deposition products form within an active layer, which has the undesirable effect of lowering the device properties.

The heating time for the semiconductor wafer is preferably 10 to 60 minutes. At a heating time of less than 1 minute, it is difficult to form the light element which has been ion-implanted in the semiconductor wafer into bubbles.

Moreover, in this invention, because splitting is carried out using the cleavage planes, the single-crystal wafer can be split before heat treatment is completed by, for example, applying an outside force in a direction that promotes splitting of the single-crystal wafer during heat treatment.

In the method for manufacturing a semiconductor substrate of the present invention, the single-crystal wafer may be an active-layer-forming wafer, the light element may be ion-implanted to the predetermined depth position in the active-layer-forming wafer, the active-layer-forming wafer and a supporting wafer for supporting the active-layer-forming wafer may be bonded together with a dielectric layer therebetween so as to form a bonded wafer, and during a heat treatment after bonding of the active-layer-forming wafer with the supporting wafer, the active-layer-forming wafer may split off from inside the ion-implanted region, leaving behind a portion of the active-layer-forming wafer.

In this case, when the bonded wafer is heat-treated, light-element bubbles form along the cleavage planes in the ion-implanted region of the active-layer-forming wafer. This causes the ion-implanted side of the active-layer-forming wafer to split off, leaving a portion of the active-layer-forming wafer behind on the supporting wafer side. The active layer of the resulting bonded SOI substrate thus has a high in-plane uniformity in the thickness, and a device-forming side (surface) of the active layer also has a high flatness.

As used herein, "semiconductor substrate" refers to a bonded SOI substrate obtained by placing an active layer on a supporting wafer with a dielectric layer therebetween.

No limitation is imposed on the type of the dielectric layer. For example, it may be a buried silicon oxide layer. The thickness of the dielectric layer is not subject to limitation and may be, for example, from 0.1 to 0.5 µm.

No limitation is imposed on the thickness of the active layer. For example, it may be from 20 to 50 µm. Alternatively, in the case of a thin-film active layer, the thickness may be from 0.01 to 20 µm.

The supporting wafer may be a (111) wafer or a (110) wafer the surface of which is a cleavage plane, and may even be a (100) wafer the surface of which is not a cleavage plane. However, a (100) wafer is desirable because when it is cut and split into rectangular chips, the cleavage planes orthogonal to the surface of the (100) wafer form rectangular shapes, making cutting easy.

Bonding of the active-layer-forming wafer and the supporting wafer may be effected by, for example, stacking together the two wafers at room temperature, then carrying out bonding heat treatment. The heat treatment temperature in this step is 800° C. or more, and may be, for example, 1100° C. The bonding heat treatment time may be, for example, 2 hours. A suitable gas such as oxygen may be used as the ambient gas within a thermal oxidation furnace used for carrying out this step.

Splitting of the active-layer-forming wafer may be carried out during the bonding heat treatment. Alternatively, the active-layer-forming wafer may be split in a separate heat treatment operation from the bonding heat-treatment.

In the method for manufacturing a semiconductor substrate of the present invention, the heat treatment may be one-directional heat treatment in which the light-element bubbles successively form parallel to the surface of the single-crystal wafer from one end of the single-crystal wafer.

In this case, the ion-implanted single-crystal wafer is one-directionally heat treated. Specifically, the heated region within the single-crystal wafer is made to travel locally parallel to the wafer surface. Within an intermediate portion of the ion-implanted region in the thickness direction (region of high ion implant density) where the implant density is greatest, light-element bubble nuclei caused by ion implantation form starting at one end of the single-crystal wafer, then light-element bubbles continuously grow in order from the nuclei at that end of the single-crystal wafer. As a result, the light-element bubble-forming region has a small thickness compared with the prior art in which the single-crystal wafer is uniformly heated within the plane of the wafer. Hence, the roughness at the wafer split surface can be further reduced and the in-plane uniformity in the wafer thickness after splitting can be made even higher. Furthermore, it enables the amount of subsequent wafer processing including the amount of etching and polishing to be reduced even further.

One-directional heat treatment may be carried out by using, for example, a technique in which the position of the single-crystal wafer within a heat treatment furnace is fixed, and the heat source is made to travel in a direction parallel to the surface of the wafer. Or a technique in which the heat source is kept stationary and the single-crystal wafer is moved in a direction parallel to the wafer surface can also be used. Yet another technique is to have both the heat source and the single-crystal wafer move in directions parallel to the wafer surface. Providing a temperature gradient within the heat treatment furnace facilitates the continuous formation of light-element bubbles.

The acceleration voltage at the time of light-element ion implantation is 50 keV or less, preferably 30 keV or less, and more preferably 20 keV or less. In the light-element ion implantation, the lower the acceleration voltage, the greater the degree to which the light element can be concentrated at the target depth. The result is a light-element bubble region of smaller width and a split surface of higher flatness.

No limitation is imposed on the type of splitting heat treatment apparatus with which one-directional heat treatment is carried out. For example, use can be made of an apparatus equipped with a heat treatment furnace which has a heat source for heat-treating the single-crystal wafer in which light element has been ion-implanted to a predetermined depth position and which carries out heat treatment with this heat source to form light-element bubbles within the ion-implanted region of the single-crystal wafer, and also equipped with a moving means which moves the heat source and the single-crystal wafer relative to each other and parallel to the surface of the single-crystal wafer so as to continuously form light-element bubbles in order from one end of the wafer.

No limitation is imposed on the type of splitting heat treatment apparatus. For example, the furnace may be a vertical or horizontal furnace. The overall apparatus may be of a single wafer processing type in which the single-crystal wafers are processed one at a time, or may be of a batch processing type in which a plurality of single-crystal wafers are processed at the same time.

No limitation is imposed on the type of the heat source. For example, use can be made of a halogen lamp, arc lamp, graphite heater, xenon flash lamp or laser generator. Regardless of which type of the heat source is used, it is desirable for the heat source to be arranged as linear strips at an interior of the heat treatment furnace.

The moving means may be, for example, a mechanism for moving the single-crystal wafer relative to the heat source. Alternatively, a mechanism for moving the heat source relative to the single-crystal wafer may be used. Use can also be made of a mechanism which moves both the single-crystal wafer and the heat source. No limitation is imposed on the moving means used in the moving means. Illustrative examples include any of various actuator mechanisms, such as a screw-type actuator or an electric cylinder actuator.

In the method for manufacturing a semiconductor substrate of the present invention, the light element may be hydrogen.

Moreover, the single-crystal wafer may be a (111) wafer or a (110) wafer composed of single-crystal silicon.

PREFERRED EMBODIMENTS

Embodiments of the present invention are described below in conjunction with the attached drawings. A first embodiment is initially described while referring to FIGS. 1A to 1D.

Two types of single-crystal silicon ingot are pulled by the Czochralski (CZ) method: a (111) single-crystal silicon ingot and a (110) single-crystal silicon ingot in which, respectively, the (111) plane and the (110) plane are orthogonal to the pull direction and which are made of p-type silicon doped with a specific amount of boron. These single-crystal silicon ingots are then subjected to a number of operations, including block cutting, wafer slicing, edge grinding and mirror polishing. Thereby mirror-polished active-layer-forming wafers 10 of p-type (111) wafers and active-layer-forming wafers 10 of p-type (110) wafers having a thickness of 725 µm, a diameter of 200 mm and a resistivity of 20 Ωcm are obtained.

Each of the active-layer-forming wafers 10 is then subjected to a thermal oxidation treatment at 1000° C. in an oxygen gas atmosphere for 5 hours, thereby forming a silicon oxide layer 10b over the entire exposed surface of the wafer 10.

Figure 1A:
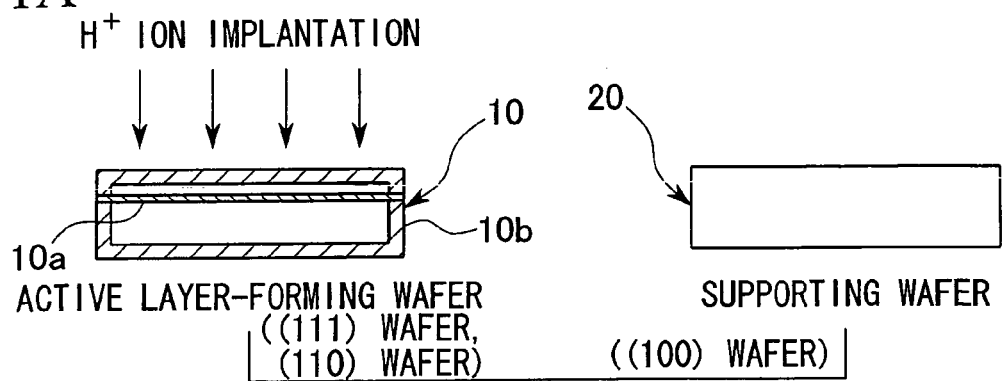
FIG. 1A is part of a flow sheet showing, in a method for manufacturing a semiconductor substrate according to a first embodiment of the present invention, a step in which hydrogen ions are implanted to a back side of an active-layer-forming wafer.

Next, using a medium-current ion implanter, hydrogen ions are implanted at an acceleration voltage of 50 keV to a back side (at a predetermined depth position from a mirror-polished front side) of the active-layer-forming wafer 10 in which the silicon oxide layer is formed (FIG. 1A). The dose at this time is $5 \times 10^{16}$ atoms/cm$^2$. The hydrogen-ion-implanted region 10a is shown in FIGS. 1A, 1B and 2.

Figure 1B:
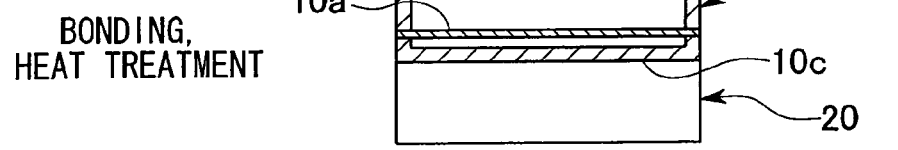
FIG. 1B is part of a flow sheet showing, in a method for manufacturing a semiconductor substrate according to a first embodiment of the present invention, a step in which an active-layer-forming wafer and a supporting wafer are bonded together.
Figure 2:
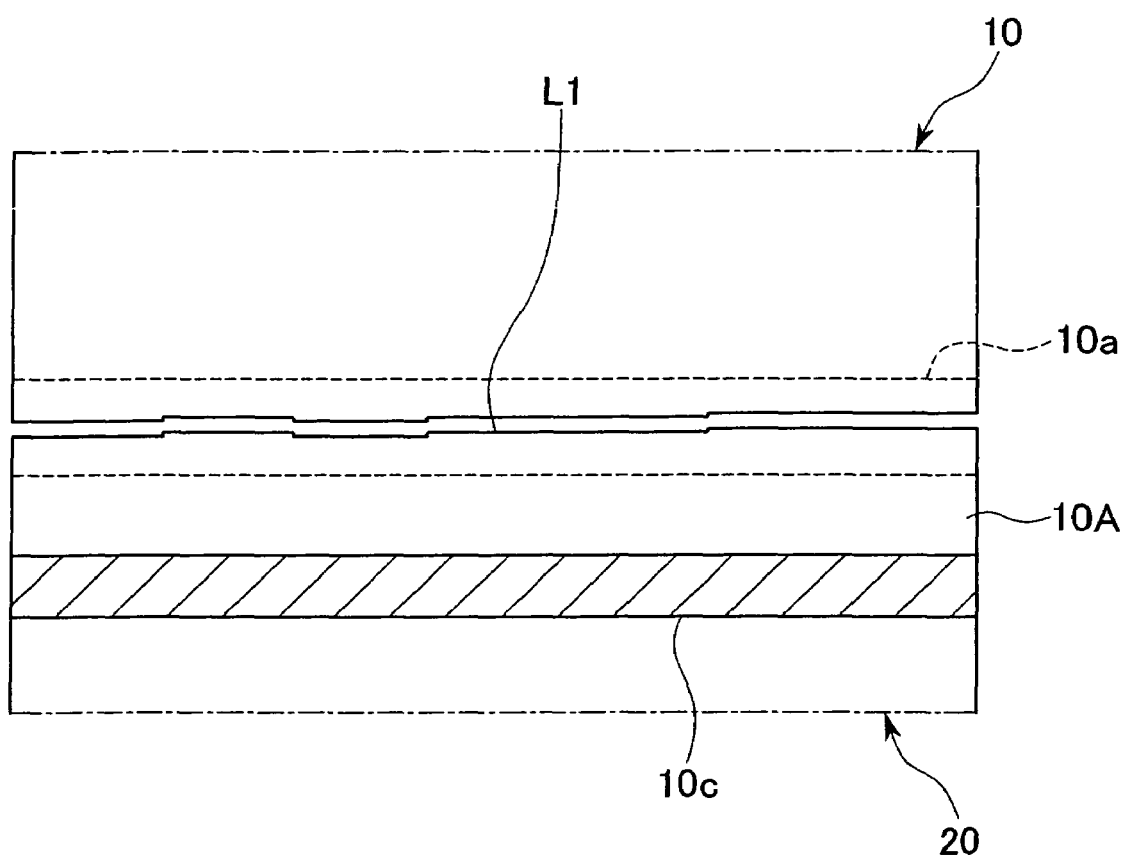
FIG. 2 is an enlarged sectional view of essential features which illustrates splitting of the semiconductor wafer in the method for manufacturing a semiconductor substrate according to a first embodiment of the present invention.

Then, with the front side of the active-layer-forming wafer 10 and the mirror-polished side of an already prepared supporting wafer 20 as bonding faces (layering faces), the two wafers 10 and 20 are bonded within a suitable device such as vacuum device using a known type of jig (FIG. 1B). The supporting wafer 20, aside from being a (100) wafer obtained from a (100) single-crystal silicon ingot, is fabricated by the same process as the active-layer-forming wafer 10. During wafer bonding, the silicon oxide layer 10b between the active-layer-forming wafer 10 and the supporting wafer 20 becomes a buried silicon oxide layer 10c.

Figure 1C:
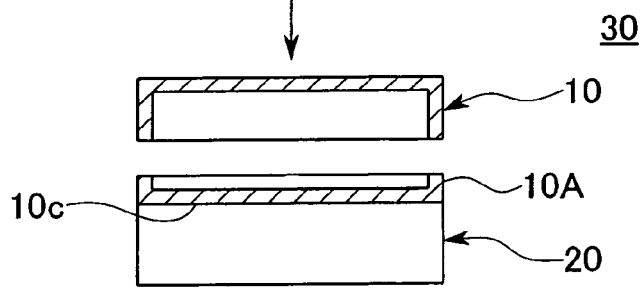
FIG. 1C is part of a flow sheet showing, in a method for manufacturing a semiconductor substrate according to a first embodiment of the present invention, a step in which the active-layer-forming wafer is split from the bonded wafer.

The resulting bonded wafer 30 is subsequently inserted in the splitting heat treatment apparatus, and is subjected to low-temperature heat treatment at a furnace temperature of 500° C. in a N$_2$ gas (argon gas or oxygen gas is also acceptable) atmosphere for 30 minutes. As a result, the active-layer-forming wafer 10 splits off, leaving behind an active layer 10A on a bonding interface side of the supporting wafer 20 with the buried silicon oxide layer 10c located therebetween (FIGS. 1C and 2).

Specifically, during low-temperature heat treatment, hydrogen bubbles form along a cleavage plane parallel to the wafer surface within the ion-implanted region 10a. Of the silicon single-crystal planes, the (111) plane has the highest atom density and Young's modulus, and the bond strength between (111) planes is lower than the bond strengths between other planes, such as (100) planes. Thus, the (111) planes form cleavage planes that is readily cleaved. The planes which are next in terms of atom density and ease of cleavage are the (110) planes. Hence, in contrast with the prior-art splitting of an active-layer-forming wafer (a (100)

wafer), when hydrogen bubbles are formed within the ion-implanted region 10a, if the active-layer-forming wafer 10 is a (111) wafer or a (110) wafer, the ion-implanted side of this wafer 10 can be split while the hydrogen bubbles are still small.

The split surface L1 of the active layer 10A is a cleavage plane, and so has a high degree of flatness. The roughness of the split surface L1 is thus lower, and the active-layer-forming wafer 10 following splitting has a higher in-plane uniformity in the thickness. As a result, the amount of polishing in the subsequent polishing step can be reduced.

Figure 1D:
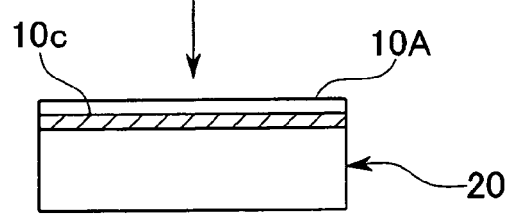
FIG. 1D is part of a flow sheet showing, in a method for manufacturing a semiconductor substrate according to a first embodiment of the present invention, a step in which a front side of the active layer is polished.

The surface of the active layer 10A on the resulting bonded wafer 30 having an SOI structure is then polished using a polisher (FIG. 1D).

A second embodiment of the present invention is now described while referring to FIGS. 3 to 5A and 5B.

Figure 3:
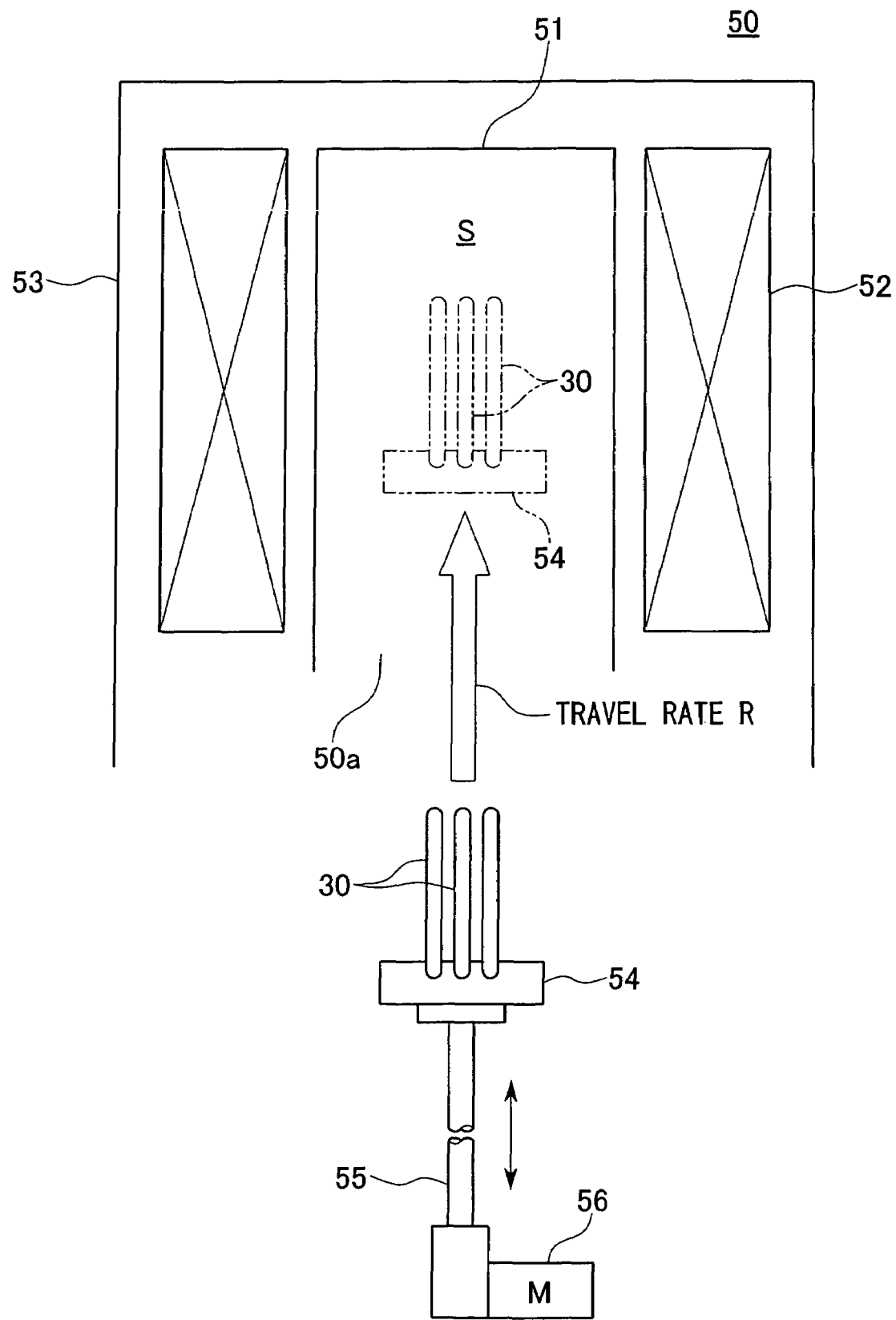
FIG. 3 is a schematic view showing the use of a splitting heat treatment apparatus according to a second embodiment of the present invention.

The second embodiment is characterized by using, as the low-temperature heat treatment operation on the bonded wafer 30, one-directional heat treatment in which hydrogen bubbles are continuously formed parallel to the surface of the active-layer-forming wafer 10 and in order from one end of the active-layer-forming wafer 10 (FIG. 3).

The splitting heat treatment apparatus 50 for one-direction heat treatment includes primarily a vertical reaction furnace 51 made of quartz, a heater 52 of cylindrical shape which surrounds an outer periphery of the reaction furnace 51, a housing 53 which encloses the heater (heat source) 52 and the reaction furnace 51, a wafer holder 54 which holds a plurality of bonded wafers 30 in a vertical state, a support shaft 55 which supports the wafer holder 54, and a motor (moving means) 56 which raises and lowers the bonded wafers 30 at a travel rate R by means of the support shaft 55 and the wafer holder 54.

Figure 4:
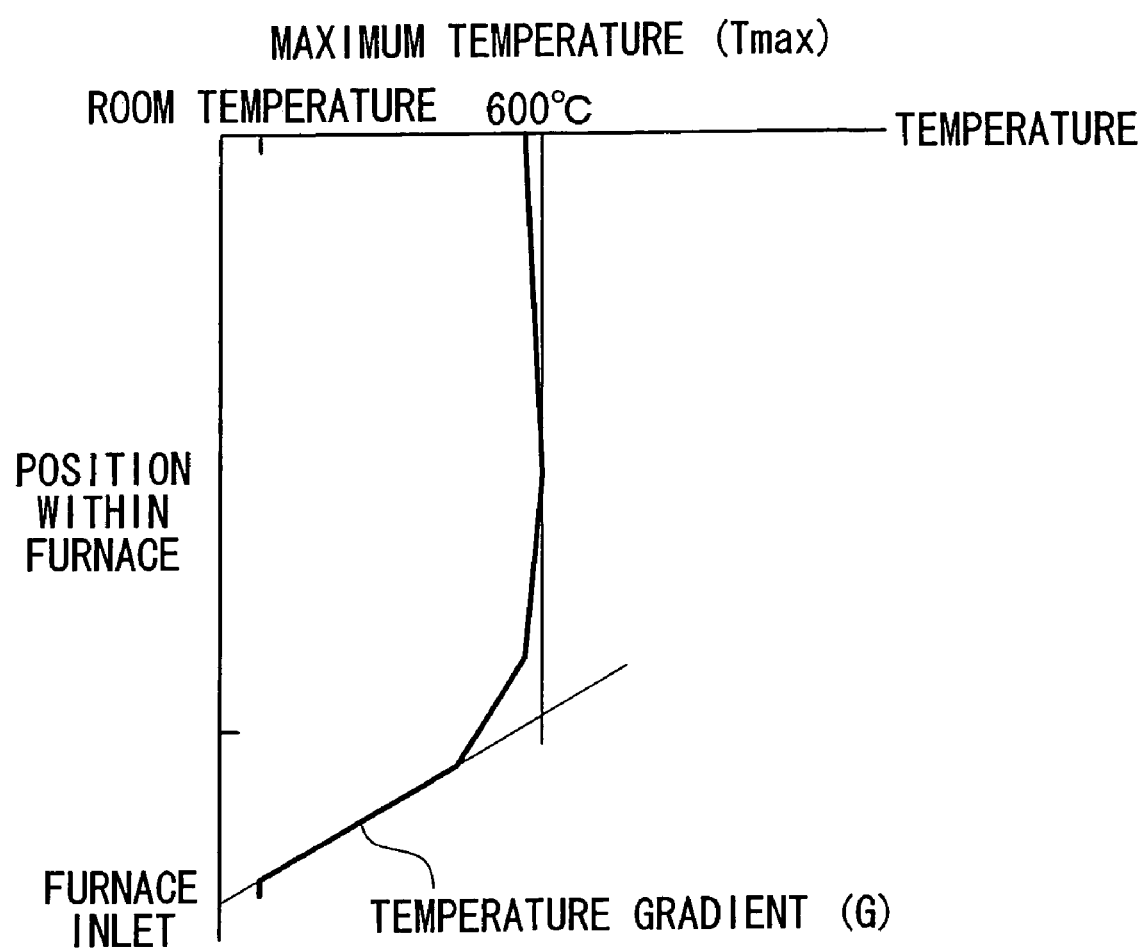
FIG. 4 is a graph of the temperature distribution within the heat treatment furnace in the method for manufacturing a semiconductor substrate according to the second embodiment of the present invention.

Substantially the entire interior space of the reaction furnace 51 forms a heat treatment stage S for the bonded wafers 30. The heater 52 is a linear heat source disposed over substantially the entire length in the height direction of the reaction furnace 51. Specifically, it is composed of a plurality of halogen lamps arranged at a given pitch. By using such heaters 52 to carry out heating, there exists a given temperature gradient G within the reaction furnace 51 (FIG. 4). Moreover, a wafer inlet/outlet 50a is formed at the bottom end of the reactor 51.

Next, splitting heat treatment of the active-layer-forming wafer 10 using the foregoing heat treatment apparatus 50 is described.

Prior to a heat treatment, the interior of the reaction furnace 51 is set to a temperature of 600° C. and placed under a nitrogen gas atmosphere. Three bonded wafers 30 are loaded in a vertical state onto the wafer holder 54 below the reaction furnace 51. The relationship between the temperature gradient G and a travel rate R of the bonded wafer 30 is then set to G/R>1 (in units of (°C.·min)/cm$^2$).

Next, the motor 56 gradually raises the wafer holder 54 at the travel rate R by means of the supporting shaft 55, thereby introducing the bonded wafers 30 into the reaction furnace 51 through the wafer inlet/outlet 50a.

Figure 5A:
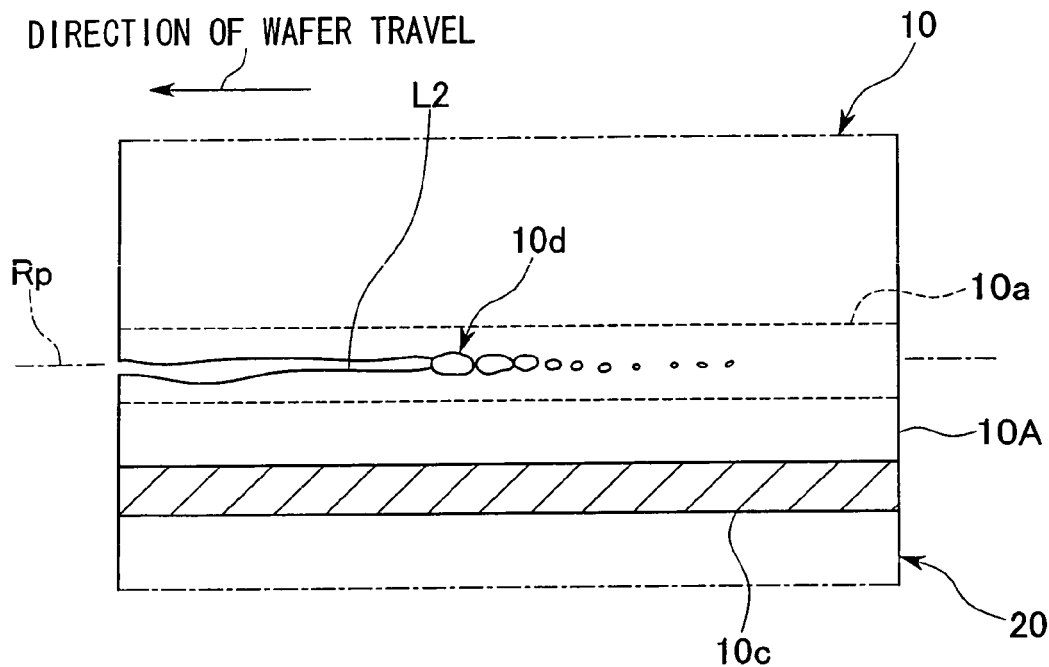
FIG. 5A is an enlarged sectional view of essential features which illustrates the splitting of the semiconductor wafer in the method for manufacturing a semiconductor substrate according to the second embodiment of the present invention.
Figure 5B:
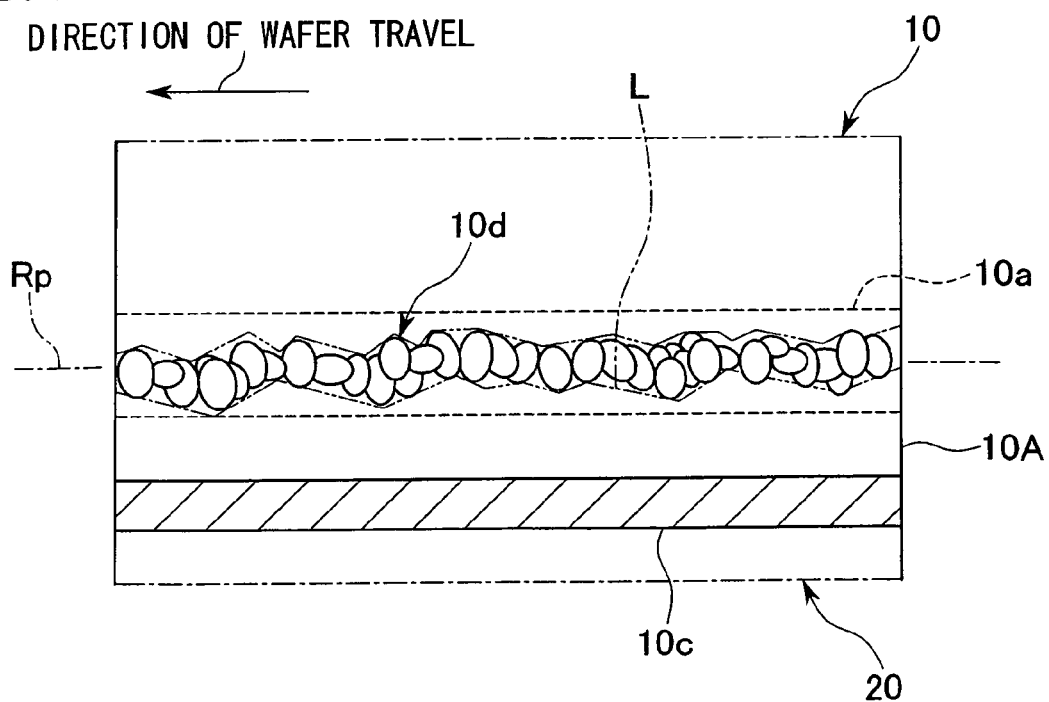
FIG. 5B is an enlarged sectional view of essential features which illustrates the splitting of the semiconductor wafer in a method for manufacturing a semiconductor substrate according to the prior art.

The bonded wafers 30 are one-directionally heat-treated at this time while causing the heated region within the active-layer-forming wafer 10 to locally travel parallel to the surface of the active-layer-forming wafer 10. That is, as shown in FIG. 5A, within the ion-implanted region 10a of the active-layer-forming wafer 10, hydrogen bubble nuclei caused by ion implantation form in order from one end (direction-of-travel end) of the active-layer-forming wafer 10 along the high-density line Rp where the hydrogen ion implant density is highest. Meanwhile, the light-element bubbles grow in order from the nuclei which have formed at one end of the active-layer-forming wafer 10. The hydrogen bubble-forming region 10d thus has a smaller thickness than when the active-layer-forming wafer is heated uniformly within the plane of the wafer as in the prior art (FIG. 5B). As a result, splitting of the active-layer-forming wafer 10 by the growth of hydrogen bubbles proceeds in order from the wafer end along this continuous succession of hydrogen bubbles. A split surface L2 on the active layer 10A obtained by splitting can thus be held to a lower degree of roughness than a split surface L1 in the prior art (FIG. 5B) and even the split surface L1 in the first embodiment (FIG. 2), making it possible to further increase both the in-plane uniformity in the thickness of the active layer 10A after splitting and the flatness at the surface of the active layer 10A. In addition, the amount of polishing of the surface of the active layer 10A in the subsequent polishing step can be further reduced.

Also, one-directional heat treatment is administered here so as to satisfy the relationship G/R>1 between the temperature gradient G and the travel rate R. Hence, continuous formation of the hydrogen bubbles is readily achieved. This is because a larger temperature gradient within the reaction furnace and a slower hydrogen bubble growth rate are more advantageous for continuous formation of the hydrogen bubbles.

The wafer holder 54 then continues to rise and, on reaching the center portion of the reaction furnace 51, stops for 30 minutes. The temperature within the furnace at this position is 600° C. Here, the active-layer-forming wafer 10 splits completely, leaving behind an active layer 10A on a bonding plane of the supporting wafer 20 with a buried silicon oxide layer 10c therebetween. In this way, there is obtained a bonded wafer 30 having an SOI structure.

Following splitting, the motor 56 rotates in the opposite direction to that during raising of the wafer holder 54, thereby lowering the wafer holder 54 by means of the supporting shaft 55 and discharging the bonded wafer 30 having an SOI structure through the wafer inlet/outlet 50a.

Other features and advantages of this embodiment are substantially like those in the first embodiment and thus omitted from the foregoing discussion.

Test results on the roughness of the split surface of the active layer following splitting of the active-layer-forming wafer are presented in Table 1 for bonded wafers for forming SOI substrates according to the present invention (Test Examples 1 and 2) and for a bonded wafer for forming a SOI substrate according to the prior art (Comparative Example 1). In both of the test examples and the comparative example, the bonded wafers were manufactured in accordance with the method for manufacturing a semiconductor substrate used in the first embodiment. The surface roughness of the active layer was evaluated with an atomic force microscope (AFM) over a region 2 μm×2 μm in size.

TABLE 1

| | Surface of active-layer-forming wafer | Hydrogen ion dose (atoms/cm$^2$) | Roughness at split surface (P-V), nm |
|---|---|---|---|
| Comparative Example 1 | (100) plane | 5 × 10$^{16}$ | 46 |
| Test Example 1 | (111) plane | 5 × 10$^{16}$ | 17 |
| Test Example 2 | (110) plane | 5 × 10$^{16}$ | 43 |

As is apparent from Table 1, in Test Examples 1 and 2 in which a (111) wafer or a (110) wafer was used as the active-layer-forming wafer, the surface roughness at the split surface (surface of active layer) was small in both cases: 17 nm and 43 nm. In particular, the (111) wafer had the lowest (best) surface roughness. In contrast, the surface roughness in Comparative Example 1 was 46 nm.

Because this method for manufacturing a semiconductor substrate employs a single-crystal wafer of which a surface is a cleavage plane as the wafer to be split by light-element ions, the single-crystal wafer readily splits from the cleavage plane within the ion-implanted region while maintaining a high flatness. Hence, after being split, the wafer has a high in-plane uniformity in the thickness, reducing the amount of wafer processing that needs to be carried out subsequently during planarization of the split surface.

In particular, the single-crystal wafer may be an active-layer-forming wafer, the light element may be ion-implanted at a predetermined depth position in the active-layer-forming wafer, the active-layer-forming wafer and a supporting wafer for supporting the active-layer-forming wafer may be bonded together with a dielectric layer therebetween to form a bonded wafer, and during heat treatment after bonding of the active-layer-forming wafer with the supporting wafer, the active-layer-forming wafer may be split off from inside the ion-implanted region, leaving behind a portion of the active-layer-forming layer. In this case, because a single-crystal wafer having a surface that is a cleavage plane is used as the active-layer-forming wafer for the bonded SOI wafer, the active layer in the bonded SOI wafer has a higher in-plane uniformity in the thickness and the device-forming surface of the active layer has a higher flatness.

Also, the heat treatment operation may be one-directional heat treatment in which the light-element bubbles continuously form parallel to the surface of the single-crystal wafer and in order from one end of the single-crystal wafer. In this case, because the single-crystal wafer in which light element has been ion-implanted is one-directionally heat-treated, the light-element bubble-forming region has a smaller thickness than that formed when the single-crystal wafer is uniformly heated within the wafer plane as in the prior art. Hence, the split surface of the wafer has an even lower roughness and the wafer the amount of subsequent wafer processing such as etching and polishing required is further reduced.

Some preferred embodiments of the present invention have been described above, although these embodiments are to be considered in all respects as illustrative and not limitative. Those skilled in the art will appreciate that various additions, omissions, substitutions and other modifications are possible without departing from the spirit and scope of the present invention as disclosed in the accompanying claims.

What is claimed is:

1. A method for manufacturing a semiconductor substrate, the method comprising:

ion-implanting a light element to a predetermined depth position in a single-crystal wafer of which a surface is a cleavage plane; and heat-treating the single-crystal wafer so as to form light-element bubbles along a cleavage plane parallel to the surface of the single-crystal wafer within an ion-implanted region and thereby splitting off a portion of the single-crystal wafer on an ion-implanted side, wherein the heat treatment is a one-directional heat treatment in which the light-element bubbles successively form parallel to the surface of the single-crystal wafer, in order, from one end of the single-crystal wafer, a heated region within the single-crystal wafer is made to travel locally parallel to the wafer surface, and the heat treatment is carried out parallel to the wafer surface and successively from one end of the wafer, the single-crystal wafer is heat-treated using a heat treatment furnace, a heat source is arranged as linear strips at an interior of the heat treatment furnace, and a temperature gradient is provided within the heat treatment furnace, and the single-crystal wafer is a (111) wafer composed of single-crystal silicon.

2. A method for manufacturing a semiconductor substrate according to claim 1, wherein the single-crystal wafer is an active-layer-forming wafer, the light element is ion-implanted to the predetermined depth position in the active-layer-forming wafer, the active-layer-forming wafer and a supporting wafer for supporting the active-layer-forming wafer are bonded together with a dielectric layer therebetween so as to form a bonded wafer, and during a heat treatment after bonding of the active-layer-forming wafer with the supporting wafer, the active-layer-forming wafer splits off from inside the ion-implanted region, leaving behind a portion of the active-layer-forming wafer.

3. A method for manufacturing a semiconductor substrate according to claim 1, wherein the light element is hydrogen.

* * * * *